United States Patent [19]

Marshall

[11] Patent Number: 5,132,978
[45] Date of Patent: Jul. 21, 1992

[54] LASER AMPLIFIER

[75] Inventor: Ian W. Marshall, Woodbridge, England

[73] Assignee: British Telecommunications public limited company, London, England

[21] Appl. No.: 555,447

[22] PCT Filed: Mar. 1, 1989

[86] PCT No.: PCT/GB89/00212

§ 371 Date: Aug. 13, 1990

§ 102(e) Date: Aug. 13, 1990

[87] PCT Pub. No.: WO89/08340

PCT Pub. Date: Sep. 8, 1989

[51] Int. Cl.⁵ ............................................. H01S 3/10
[52] U.S. Cl. ..................................... 372/27; 372/105; 372/106
[58] Field of Search ................. 372/21, 22, 27, 105, 372/106

[56] References Cited

U.S. PATENT DOCUMENTS

| | | |
|---|---|---|
| 3,949,318 | 4/1976 | Zeidler . |
| 4,400,052 | 8/1983 | Alferness et al. . |
| 4,637,027 | 1/1987 | Shirasaki et al. ............... 372/27 |
| 4,689,797 | 8/1987 | Olshansky . |
| 4,918,701 | 4/1990 | Amann et al. ................... 372/50 |
| 5,012,474 | 4/1991 | White et al. ..................... 372/27 |

FOREIGN PATENT DOCUMENTS 60-198879 10/1985 Japan .

OTHER PUBLICATIONS

Journal of Lightwave Technology, vol. LT-5, No. 1, Jan. 1987, pp. 184–189, IEEE, New York, US JINWEI Wang et al: "Recombination, gain and bandwidth characteristics of 1.3 mum semiconductor laser amplifiers".
Electronics & Communications in Japan, vol. 70, No. 2, part 2, Feb. 1987 pp. 38–52; Scripta Technica Inc., New York, US T. Mukai et al: "1.5 mum InGaAsP Fabry-Perot cavity-type laser amplifiers".
Patent Abstracts of Japan, vol. 10, No. 42 (E-382)(2099), Feb. 19, 1986, p. 126 & JP-A-60 198 879 (Fujitsu K.K.)Aug. 10, 1985.
Electronics Letters, vol. 22, No. 21, Oct. 9, 1986, pp. 1105–1107, Hitchin, Herts, GB R. M. Jopson et al: "Polarization-dependent gain spectrum of a 1.5 mum travelling-wave optical amplifier".
Journal of Applied Physics, vol. 59, No. 1, Jan. 1, 1986, pp. 28–31; Am Inst. of Physics, New York, US Y Sasai et al: "Fabrication and lasing characteristics of 1.3 mum InGaAsP multiquantum-well lasers".
IEEE Journal, of Quantum Electronics, vol. QE-24, No. 1, Jan. 1988, pp. 52–59; IEEE, New York, US M. G. Oberg et al: "Crosstalk between intensity-modulated wavelength division multiplexed signals in a semiconductor laser amplifier".

*Primary Examiner*—Georgia Y. Epps
*Attorney, Agent, or Firm*—Nixon & Vanderhye

[57] ABSTRACT

A laser amplifier in which the effective refractive index of the active region for the TE and TM modes is sufficiently different to provide multiple mode ripple beat frequency overlap within a 3dB gain envelope peak. The active region is made highly asymmetric with an aspect ratio of at least 10:1 and preferably 20:1 in order to provide the effective refractive index difference. Steps, grading or uniform difference in the material refractive index may also be used. The confinement factor ratio is made as high as possible by providing different material refractive index in the orthogonal dimensions of the active region cross section.

13 Claims, 2 Drawing Sheets

LASER AMPLIFIER

FIELD OF THE INVENTION

This invention relates to laser amplifiers.

BACKGROUND AND SUMMARY OF THE INVENTION

In semiconductor laser amplifiers it is generally found that it is difficult to have identical confinement factors for the orthogonal polarisations of input light, which propagate within the active region or, more generally, within the waveguide region (of which the active region forms the core and the cladding includes additional layers, as the TE and TM modes. Usually there is a higher peak gain for the TE mode than for the TM mode. The result of this is that for laser amplifiers there is a variation in the gain of the amplifier dependent upon the polarisation of the input optical signal. In practical terms this polarisation sensitivity means that the amplifier can not be operated consistently at maximum gain and as the polarisation changes the amplifier bias has to be adjusted to increase or decrease the gain to a consistent operating level.

One solution to polarisation sensitivity is to utilise a polarisation scrambler on the light input to the laser amplifier, but this has the disadvantages of a reduction in gain (usually 3dB) and, more significantly, at high bit rates a degraded signal to noise ratio due to noise originating in the scrambler.

Within a waveguide the effective refractive index is a function of the refractive index of the material and also the dimensional ratio of the waveguide, so that an asymmetric waveguide or active region has an asymmetric effective refractive index. This asymmetric refractive index arises from a difference in the propagation constants for TE and TM. The difference in propagation constants may also lead to a difference in TE and TM confinement factors which will in turn result in different TE and TM gains. One way around the problem of different TE and TM gains would be to fabricate symmetrical waveguides, but in practice such a structure is difficult to fabricate and does not lend itself to efficient optical coupling to and from the amplifier. It has however been the trend, as far as possible, to fabricate waveguide regions with minimum asymmetry because this produces a more symmetrical spot and eliminates the need for anamorphic coupling lenses.

An alternative approach would be for a laser to be fabricated that has an asymmetric active region but nevertheless has similar confinement factors for TE and TM. Devices have been fabricated with confinement factor ratios as close as 0.9 (within this specification confinement factor ratios are given as TM/TE, and are therefore generally less than unity) in which the gain peaks for TE and TM have a gain difference of only 2.5dB (apparently enabling operation within the top 2.5dB gain) and thus this appears to offer an improvement over the 3dB loss and attendant noise of a polarisation scrambler. However, within the waveguide region of such devices although the confinement factors have been closely similar giving close gain envelope peaks, there are longitudinal mode ripples superimposed on the gain characteristic which result from residual cavity reflectivity. Due to the asymmetry of effective refractive index resulting from waveguide asymmetry the longitudinal mode ripples are of a slightly different frequency for the different polarisations and are not in general in phase so that although the peaks of the 3dB ripple envelopes of TE and TM gain may lie only 2.5dB apart the actual gain difference at a given wavelength is usually greater than this, for example about 5dB, because of the longitudinal mode ripples being out of phase.

The approach adopted in the present invention is to make the effective refractive index in the waveguide region for the different polarisations sufficiently different to provide frequent longitudinal mode ripple coincidence within the gain envelope peak.

Accordingly the present invention provides a laser amplifier in which the active region has an effective refractive index difference for light propagating in the TE and TM modes such that one of the TE and TM modes has a greater number of longitudinal modes oscillating within the 3dB gain envelope than the other, and such that at least four longitudinal modes oscillating in the TE mode substantially coincide in wavelength with longitudinal modes oscillating in the TM mode within said 3dB gain envelope.

According to another aspect of the invention there is a laser amplifier having a cavity in which there is an effective optical path length difference between TE and TM propagating polarisations of at least $2.5 \times 10^{-4}$ meters.

BRIEF DESCRIPTION OF THE DRAWINGS

The invention is now described by way of example with reference to the accompanying drawings in which.

DETAILED DESCRIPTION OF THE DRAWINGS

In semiconductor laser amplifiers residual facet reflectivity gives rise to longitudinal mode ripples superimposed on the gain characteristic. Anti-reflection coatings applied to the facets may be used to minimise the ripple: at present facet reflectivities of $10^{-5}$ have been achieved which reduces ripple to 1dB for 20 dB gain, but more commonly facet reflectivities of $10^{-3}$ and ripple of 3dB has to be tolerated. The mode ripples in laser gain characteristics depend for frequency on the effective path length of the active region, i.e. on the effective refractive index and cavity length, and upon facet reflectivity for amplitude.

Figure 1:
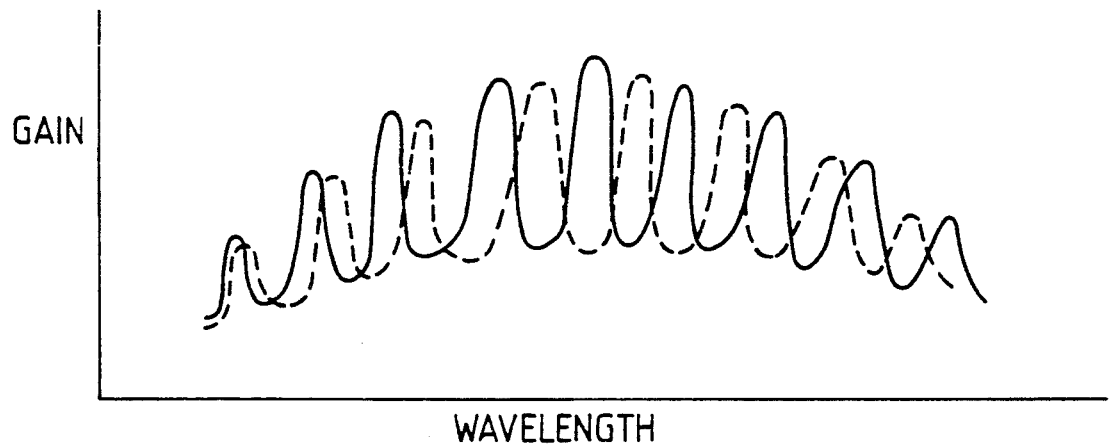
FIG. 1 is a schematic plot of gain curves for a travelling wave laser amplifier.

Referring to FIG. 1 a schematic gain versus wavelength plot is shown for a laser amplifier in which the full line represents light propagating in the TE mode, excited by one input polarisation and the dotted line represents light propagating in the orthogonal TM mode excited by the orthogonal input polarisation. The illustrated plot shows the usual effect of the longitudinal mode peaks for the orthogonal propagation modes being misaligned due to their occurrence at slightly different wavelengths and with slightly different spacing. Due to a relatively small difference in the effective path lengths for the orthogonal propagation modes the number of instances of longitudinal mode peak matching (or beat frequency) is small, and so the probability of matching occurring at the gain peak is very small. It is for this reason that at particular operating wavelengths the gain sensitivity is generally found to be greater than that expected from the gain characteristic usually considered, which is the gain envelope.

Figure 2:
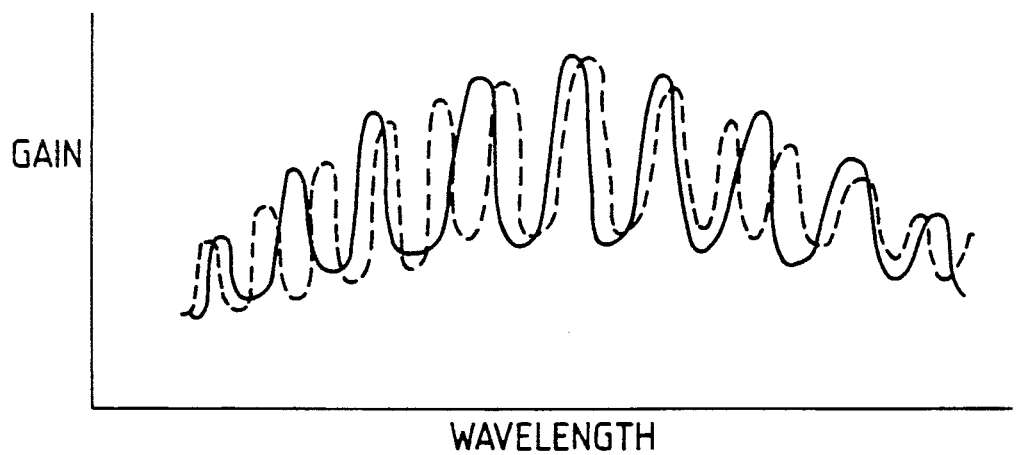
FIG. 2 is a schematic plot similar to FIG. 1 for a laser having a greater mismatch in refractive indices for TE and TM propagation.

FIG. 2 shows a similar schematic plot to that of FIG. 1, however in this instance the plot is drawn for a device in accordance with the present invention that is fabricated with a difference in effective refractive index for the orthogonal propagation modes such that there is a greater difference in the longitudinal mode frequency. In this instance matching of the longitudinal mode peaks occurs more frequently and thus the probability of matching occurring within the gain peak is much increased. (In both FIGS. 1 and 2 the TE and TM gain envelopes are shown at substantially equal levels: this degree of equalisation would in fact be difficult to achieve, the figures are drawn to demonstrate the mode coincidence aspect).

The present invention proposes fabrication of a device with differences in the effective refractive index such that one of the TE and TM modes has a greater number of longitudinal modes oscillating within the 3dB gain envelope than the other, and such that at least four mode peaks of the TE ripples are in phase with mode peaks of the TM ripples. This will provide a greater probability of longitudinal mode peak alignment at the gain peaks, and/or also a greater number of wavelengths at which the gains are matched. The confinement factors should be made as close as possible so that the ripple envelopes are as close as possible.

In order to investigate the relationship between confinement factors and effective refractive index various existing 500 micron cavity length devices were investigated for mode peak coincidence and the results are shown in Table 1.

TABLE 1

| Device | Average R.I. | Difference in R.I. | TM/TE Confinement Factor Ratio | Gain Envelope Difference | Actual peak difference |
|---|---|---|---|---|---|
| A | 3.5 | 0.03 | 0.91 | 2.5 dB | 5 dB |
| B | 3.5 | 0.08 | 0.91 | 2.5 dB | 2.5 dB |
| C | 3.5 | 0.08 | 0.85 | 3.0 dB | 3.0 dB |
| D | 3.5 | 0.03 | 0.76 | 4.5 dB | 6.0 dB |
| E | 3.5 | 0.08 | 0.76 | 4.5 dB | 4.5 dB |

Figure 3:
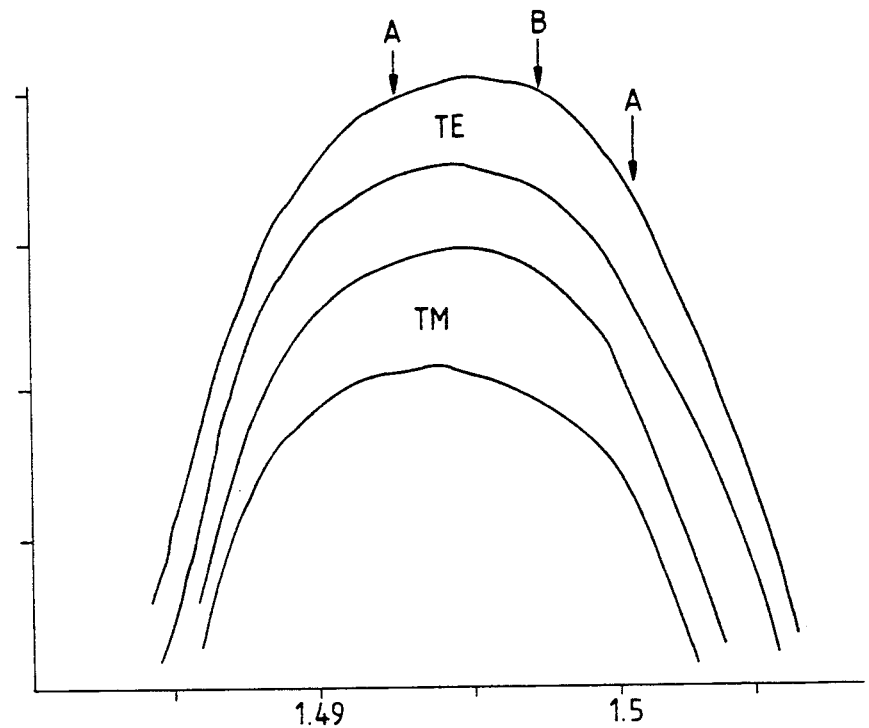
FIG. 3 shows gain envelopes for a tested laser.
Figure 4:
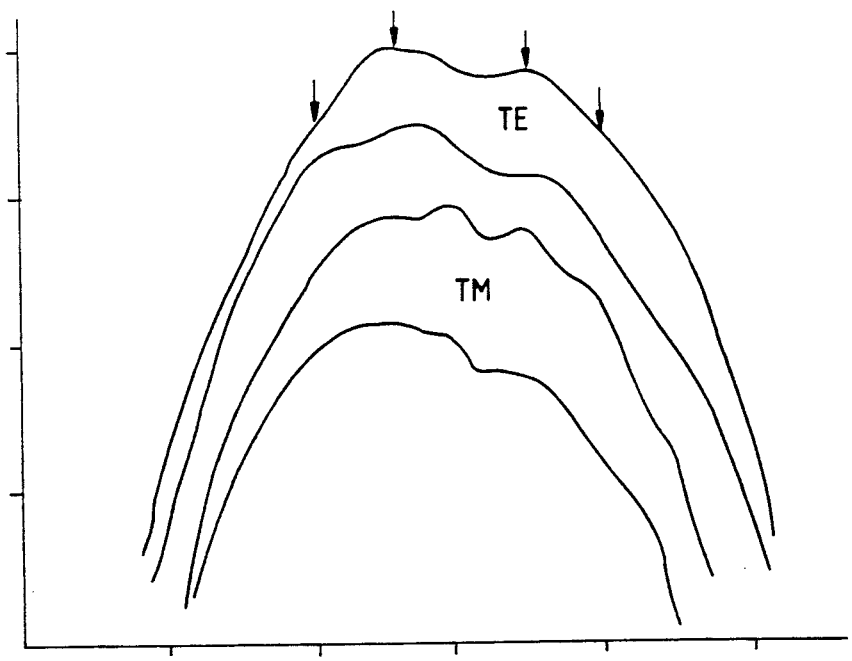
FIG. 4 shows the gain envelope for another tested laser.

It will be observed from the table that the refractive index difference can differ for a similar confinement factor. Devices B, C and E were exceptional in that they had unusually large differences in refractive index for TE and TM. The longitudinal mode envelopes for two of the devices, D and E are shown in FIGS. 3 and 4. The gain differences in these instances between the longitudinal mode envelopes are greater due to the lower confinement factor ratio, but nevertheless they demonstrate the frequency with which actual gain difference at peak gain approximates to the longitudinal mode envelope gain difference.

For device D, over the usable bandwidth of the device, which is usually defined as the range over which there is a maximum change of 3dB in the peak gain of the longitudinal mode envelope, there was only one in phase longitudinal mode peak at a wavelength of approximately 1.49 microns and a second, just beyond the 3dB bandwidth at a wavelength of approximately 1.52 microns, these points are marked with arrows A, while an out of phase point is marked, at the peak gain, by arrow B. This device is typical of the majority of available laser amplifiers and, although it may be possible to lower the gain envelope gain difference by increasing the confinement factor ratio (e.g. to the ratio for device B), the frequency with which the actual gain difference equals the gain envelope gain difference is very small and, as its location is random, it is not necessarily at the desired wavelength of the incoming signal or close to the gain peak of the gain envelopes.

FIG. 4 shows similar plots for one of the devices that was selected because of its unusually high difference in refractive index, in this case 0.08, in an average of 3.5. In this instance two in phase longitudinal mode peaks were located in the 3 dB bandwidth at wavelengths of approximately 1.49 microns and 1.51 microns, thus demonstrating an increase in frequency of occurrence over the laser amplifier of FIG. 3, but for practical purposes (and even if the gain envelope gain difference were lower) this is an insufficient number of wavelengths at which matching occurs for practical purposes.

In accordance with the invention it is proposed that devices are fabricated so that there are at least four wavelengths within the 3 dB longitudinal mode envelope bandwidth at which TE and TM propagation modes have coincident longitudinal modes. For a 500 micron cavity length this can be achieved with an effective refractive index difference of 0.16: for a 1000 micron device it could be reduced to a difference of 0.08.

In numerical terms this may be expressed in terms of the optical path length difference which is the optical path length times difference in effective refractive index.

$$n\,n^*\,L \approx 0.16 \times 3.5 \times 5 \times 10^{-4} \text{ metres}$$
$$\approx 2.5 \times 10^{-4}$$

where L is the cavity length of the laser n is the effective refractive index difference, and $n^*$ is the effective refractive index and is defined by $$n^* = c/2L\delta U$$

where c is the velocity of light and $\delta U$ is the mode spacing of the laser. Typical values of $n^*$ are 3.49 for TM and 3.61 for TE.

Preferably the ratio of the TM/TE confinement factors is at least 0.9, and the longitudinal mode occurrence frequency such that coincidence in wavelength of longitudinal modes propagating in TE and longitudinal modes propagating in TM occur at least once every ten longitudinal modes.

The effective refractive index $n^*$ is different for TE and TM propagation modes because it is also influenced by the aspect ratio of the waveguide following the general formula:

$$\delta\beta = \frac{(2\Delta)^{3/2}}{a} \cdot f(v, b/a)$$

$\delta\beta$ is the difference in propagation constants for TE and TM
 a is the height of the waveguide
 b is the width of the waveguide $2\Delta = (1 - n_1^2/n_2^2)$ where $n_1$ is the refractive index in the waveguide and n is the refractive index in the cladding $$v = 2\pi an/(\lambda \sqrt{2\Delta})$$

where n is the refractive index of the layer of propagation, in this instance that of the waveguide ($n_1$).

It is this difference in n* that gives rise to the different ripple frequencies. For a 500 micron cavity length the aspect ratio (where propagation is along the length) required is preferably in excess of 10:1, more preferably in excess of 15:1 and most preferably in excess of 20:1. Having this degree of asymmetry in the waveguide makes the natural confinement across the height or shorter dimension much less than across the width or wider dimension. In order to equalise the confinement factors, as far as possible, the waveguide is bounded by layers which will increase the relative confinement across the short dimension. The boundary layers, or confinement layers, may be made by stepping or grading the refractive index of the material around the waveguide, for example by different doping of the material or by different material composition, with the step in refractive index at the top and bottom of the waveguide being different (larger) than the step at the sides, the ratio of the material refractive index changes being in general correspondent with the aspect ratio.

It is also possible to utilise birefringent material, either in the boundary layers or in the waveguide itself. Within the waveguide birefringent material may be utilised to provide or assist in providing the necessary degree of refractive index difference without requiring, or enabling a reduction in the required, waveguide asymmetry.

Figure 5:
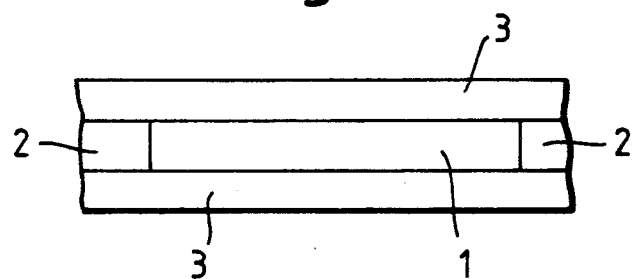
FIG. 5 is a cross section through part of an embodiment of the invention.

A preferred embodiment of the invention is shown in FIG. 5, which illustrates a cross section through the active (or waveguiding) confinement layers of a laser amplifier. The device has an active layer 1 that is highly asymmetric having a width of the order of 3 microns and a depth of 0.15 microns. This strong asymmetry results in different propagation constants and thus in different effective refractive index for the TE and TM modes. In order to match the amplitude of the TE and TM gain envelopes as closely as possible the confinement factors need to be equalised as closely as possible, and this is achieved by having a different material refractive index step between the layer 1 and laterally bounding regions 2 than between the layer 1 and layers 3 above and below the active region. The absolute value of the steps must be such as to enable maintenance of single mode propagation within the waveguide. For example the required steps may be +0.02 (in 3.5) above and below the waveguide and of the order of +0.001 laterally of the waveguide.

For devices of differing aspect ratio the approximation waveguide dimension X index step=constant will generally apply.

The precise doping profiles necessary for a device of given dimensions and the optimum absolute value of the material refractive indices to achieve the desired confinement may be designed iteratively using an equivalent index method programme which will predict the confinement factors, propagation constants, gain ripple and gain envelope.

The materials from which the device may be fabricated are any of those from which a junction diode can be fabricated, including gallium arsenide, gallium phosphide, indium arsenide, indium phosphide and tertiary and quaternary materials formed from these.

In summary, the present invention therefore proposes overcoming the polarisation sensitivity problem in laser amplifiers by increasing the difference in effective refractive index for TE and TM propagation modes to the level at which the frequency of overlap of the longitudinal mode ripples of TE and TM propagating light within the 3 dB mode envelope peak is significant In this way if the confinement factors are also made equal, or as close as possible, at the wavelengths corresponding to the longitudinal mode ripple peak overlaps the device is substantially polarisation insensitive. A practical way of bringing about the difference in effective refractive index is to have a highly asymmetric waveguide and to provide asymmetric lateral and vertical confinement steps or grading in the material of the refractive index. The problems that arise as a result of such a structure are that the spot is asymmetric and the device is wavelength sensitive. However, as far as spot asymmetry is concerned, that can be overcome, for example by coupling through a cylindrical lens and is acceptable trade off for getting polarisation insensitivity. (Suitable birefringent material may also remove this problem by replacing waveguide asymmetry, for example using a quantum well or multiple quantum well structure).

With respect to the wavelength sensitivity again this is acceptable where operation at a single, or few, wavelengths is required and maximum and/or polarisation insensitive gain is at a premium, for example in cascaded amplification where the cumulative effects of polarisation sensitivity of gain are a severe problem. In some applications the wavelength sensitivity of the polarisation insensitivity may be utilised to advantage. For example in multiply cascaded (with more than three stages) amplification where the signal is polarised, noise will be randomly polarised and at random wavelengths. In a polarisation sensitive system only the noise with the polarisation the same as the signal will be effectively amplified and the noise on the polarisation with less gain is effectively lost after several amplification stages. If such a system is rendered polarisation insensitive over a wide pass band, then all the noise will be amplified, although of course the signal benefits also from the polarisation insensitivity. With a device according to the present invention the device is polarisation sensitive off the transmission wavelength and so the reduction in noise gain operates the same as in a polarisation system, but at the transmission wavelengths the device has the advantage of polarisation insensitivity, and thus the device will provide a degree of filtering. Also in a wavelength division multiplexed system operating on channels corresponding to the longitudinal mode ripple overlap wavelengths within the 3 dB gain peak at which the amplifier is polarisation insensitive, there is a fall off in gain in both TE and TM propagation modes to each side of the operating wavelengths, and therefore the amplifier will provide a degree of natural filtering of unwanted wavelengths.

I claim:

1. A laser amplifier emitting multiple longitudinal modes within a 3dB gain envelope, said amplifier comprising a waveguide having a waveguiding cavity, and an energy source, the waveguiding cavity providing means for transferring energy from the energy source to amplify the light propagating therein, the waveguiding cavity having an effective refractive index difference for light propagating in the TE and TM transverse modes such that one of the TE and TM modes has a greater number of longitudinal modes oscillating within said 3dB gain envelope than the other, and such that at least four longitudinal modes oscillating in the TE mode substantially coincide in wavelength with longitudinal modes oscillating in the TM mode within said 3dB gain envelope.

2. A laser amplifier according to claim 1, wherein the waveguiding cavity is such that there is an effective optical path length difference between the TE and TM modes of at least $2.5 \times 10^{-4}$ meters.

3. A laser amplifier according to claim 1, wherein the waveguiding cavity comprises an active region which is surrounded by confinement regions.

4. A laser amplifier according to claim 3, wherein the refractive index is varied at the boundary between the active region and the confinement regions so as to maintain similar confinement factors for the TE and TM modes.

5. A laser amplifier according to claim 4, wherein the waveguiding cavity includes first and second pairs of opposite sides and the refractive index variation across the boundary is greater at said first pair of opposite sides than at said second pair of opposite sides.

6. A laser amplifier according to claim 5, wherein the active region is bounded by a graded index confinement region.

7. A laser amplifier according to claim 5, wherein the confinement regions at said first pair of opposite sides provide a greater refractive index step relative to the active region than is provided by the confinement regions at said second pair of opposite sides.

8. A laser amplifier according to claim 3, wherein the active region comprises birefringent material.

9. A laser amplifier according to claim 1, wherein the longitudinal modes for the TE and TM modes are substantially coincident at least once every ten modes.

10. A laser amplifier according to claim 1, wherein the ratio of the confinement factors of said waveguiding cavity for the TE and TM modes is at least 0.9.

11. A laser amplifier according to claim 5, wherein the active region is asymmetric having an aspect ratio greater than 10:1.

12. A laser amplifier according to claim 11, wherein the aspect ratio of the asymmetric active region is at least 20:1.

13. A wavelength division multiplex system including a laser amplifier according to any one of claims 1, 2, 3, 4, 5, 6, 7, 8, 9, 10, 11 or 12.

* * * * *